United States Patent [19]

Chiappetta

[11] Patent Number: 5,420,715
[45] Date of Patent: May 30, 1995

[54] RF/OPTICAL MODULATOR-DEMODULATOR

[75] Inventor: Mark C. Chiappetta, Berwyn, Pa.

[73] Assignee: Martin Marietta Corporation, East Windsor, N.J.

[21] Appl. No.: 209,141

[22] Filed: Feb. 10, 1994

[51] Int. Cl.⁶ .................................. G01R 31/00
[52] U.S. Cl. .................................. 359/245; 332/176; 324/96
[58] Field of Search ............... 359/245, 237, 238, 240, 359/241, 245, 264, 276, 280, 284; 324/95, 96; 342/54; 332/106, 149, 150, 175, 176

[56] References Cited

U.S. PATENT DOCUMENTS

| | | | |
|---|---|---|---|
| 4,070,621 | 1/1978 | Bassen et al. | 324/96 |
| 4,818,616 | 4/1989 | Milverton et al. | 428/411.1 |
| 4,885,113 | 12/1989 | Gillberg-LaForce | 252/582 |
| 4,923,288 | 5/1990 | Allen et al. | 350/355 |
| 5,055,810 | 10/1991 | de La Chapelle et al. | 332/175 |
| 5,094,553 | 3/1992 | Yakymyshyn et al. | 385/122 |
| 5,144,044 | 9/1992 | Goto et al. | 549/70 |
| 5,194,984 | 3/1993 | Boden et al. | 359/321 |
| 5,200,541 | 4/1993 | Thami | 556/110 |
| 5,202,786 | 4/1993 | Boyle et al. | 359/243 |

Primary Examiner—Mark Hellner
Attorney, Agent, or Firm—W. H. Meise; C. A. Berard; S. A. Young

[57] ABSTRACT

A modulator or demodulator has a transparent nonlinear dielectric material (crystal), and an optical fiber for coupling light thereinto. RF is coupled into the crystal by a dielectric waveguide which is matched to the crystal. The nonlinear crystal causes the light and RF to interact, to cause products which can be detected at the dielectric waveguide. When used as a modulator or demodulator, the modulated light may be coupled out by a second optical fiber, and or the modulated RF may be coupled out by a second dielectric waveguide. The dielectric waveguide may be transitioned to conventional hollow conductive waveguide.

11 Claims, 2 Drawing Sheets

RF/OPTICAL MODULATOR-DEMODULATOR

FIELD OF THE INVENTION

This invention relates to nonlinear devices useful for causing light to interact with RF, microwaves or millimeter waves for modulation or demodulation.

BACKGROUND OF THE INVENTION

It is well known that modern communications systems must have large bandwidths in order to carry the large amounts of information required by post-industrial information-dependent society. These large bandwidths are most easily accommodated in high-frequency communications systems, such as light or radio-frequency (RF), by which is meant those frequency ranges which include microwave and millimeter-wave. It may be necessary to convert signals carried by or modulated on microwaves or millimeter-waves into signals carried by light, and to similarly convert signals carried by light into signals carried by RF. These conversions are known as modulation or demodulation, depending upon whether a signal is impressed upon a carrier, or a carrier is removed.

SUMMARY OF THE INVENTION

A nonlinear interaction apparatus includes a transparent nonlinear interaction dielectric material which is preferably a nonlinear organic crystal salt (crystal) having a dielectric constant and an index of refraction. It also includes a light coupler coupled to the crystal for coupling light through a light entrance region into an interaction region of the crystal. An RF coupling arrangement is also coupled to the crystal, for coupling RF energy, which may include microwave and millimeter-wave, through an RF entrance region into the interaction region of the crystal, for thereby allowing nonlinear interaction between light and RF. The RF coupling arrangement includes a linear dielectric waveguide coupled to the RF entrance region of the crystal, for coupling RF into the crystal, where interaction may occur between the light and RF to generate nonlinear products. In the context of either a modulator or a demodulator, the nonlinear products may be modulated light or RF. The dielectric waveguide is preferably impedance matched to the crystal, and the linear dielectric of the dielectric waveguide preferably has a dielectric constant substantially equal to that of the crystal. The apparatus may further include an output coupler coupled to the crystal for coupling one or both of the light and RF after the interaction from the crystal. The output coupler may include an optical output port from which the light emerges after its interaction with the RF. The dielectric waveguide may further include a dielectric-waveguide-to-hollow-conductive-waveguide transition for coupling of the RF to and from the crystal for interaction with light.

DESCRIPTION OF THE INVENTION

Figure 1:
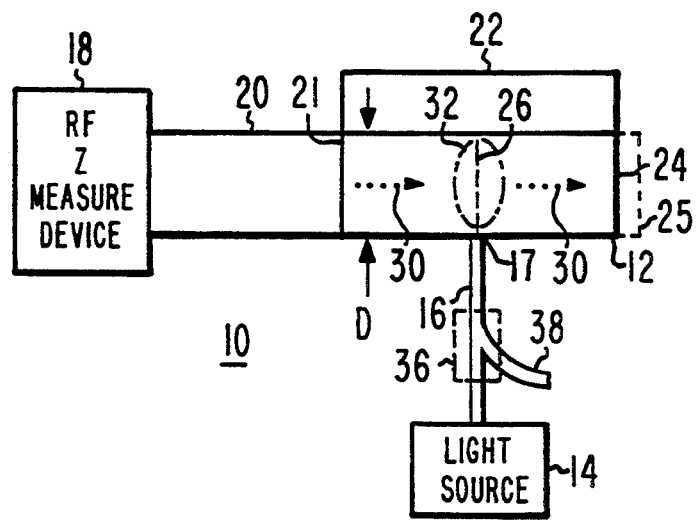
FIG. 1 is a simplified representation of a device according to the invention.

In FIG. 1, a modulator or demodulator 10 according to an aspect of the invention includes a body 12 of nonlinear dielectric material, which is preferably a nonlinear organic crystal salt (crystal) such as DAST, described in U.S. Pat. No. 5,094,553, issued Mar. 10, 1992 in the name of Yakymyshyn et al. or DASMS, described in U.S. Pat. No. 5,194,984, issued Mar. 16, 1993 in the name of Boden et al. A source of light illustrated as a block 14 is coupled to crystal 12 by an optical fiber 16 connected thereto at an optical input port 17. The light introduced by way of optical fiber 16 will form a beam which takes a path illustrated as a dash line 26 through crystal 12. As illustrated in FIG. 1, beam 26 ends at a light-absorbing layer 22, which may be, for example, a black paint.

Also in FIG. 1, a source of radio-frequency (RF) energy associated with an impedance (Z)-measuring device is illustrated as a block 18, and is coupled to crystal 12 by an RF path which includes a dielectric waveguide 20 and an RF input port 21. For purposes of this invention, RF includes those frequencies commonly referred to as "microwave," "millimeter-wave," and frequencies lying between millimeter-wave and light frequencies. Impedance measuring devices operating at RF frequencies are well known in the art, and have reached a high state of sophistication in commercial equipments such as time-domain reflectometers and frequency-swept impedance analyzers manufactured by Hewlett-Packard and other manufacturers. Dielectric waveguide 20 is impedance matched to crystal 12, at least by virtue of having a dielectric constant similar to that of the crystal, when the crystal is in its linear state, namely at low signal levels. Preferably, dielectric waveguide 20 is also impedance matched to crystal 12 by having the same transverse dimensions, illustrated as dimension D in FIG. 1.

As so far described, the arrangement of FIG. 1 applies light by path 26 through crystal 12, and applies RF from an impedance measuring device 18 to the crystal by way of a path through the crystal, which is represented as dotted path 30. RF path 30 intersects light path 26 in an interaction region illustrated by dot-dash boundary 32. Within region 32, the crystal material becomes nonlinear when the electromagnetic energy level is sufficient. In general, the device is operated at light and RF levels suited to producing significant nonlinearity when both light and RF are present, and with significantly less nonlinearity when only one is present. Assume, for example, that light source 14 produces no light. Little or no nonlinearity occurs in the crystal under such a condition, and the RF entering crystal 12 at RF input port 21 travels through the crystal in the direction of path 30, and reaches the right surface, designated 24, of the crystal. Surface 24 of the crystal is an open circuit, which reflects the RF energy back along path 30, out through port 21, through dielectric waveguide 20 to impedance measuring device 18. Those skilled in the art will recognize this condition as one which will represent a particular impedance, depending on the distance of open circuit 24 from measurement device 18. If, now, in the example, sufficient light is allowed to flow from light source 14 through optical fiber 16 to crystal 12, the additional energy or power causes the crystal to become nonlinear within interaction region 32. The nonlinearity resulting within interaction region 32 changes the propagation characteristics of the crystal to the RF, with the result that the apparent open circuit at surface 24 is replaced, as far as impedance measuring device 18 is concerned, with some other impedance, possibly closer to a short-circuit, at a lesser distance from measuring device 18. The impedance measuring device will give an indication of this difference, thereby allowing remote determination of the on or off state of light source 14. In the case of digital (ON-OFF) communication by light, the apparatus of FIG. 1 may act as a demodulator or detector, by which the digital information may be extracted from the light. While the mode of operation is more difficult to explain in the case of demodulation or detection of linear or analog information, such demodulation or detection also occurs.

While an open-circuit surface 24 of crystal 12 of FIG. 1 has been described, a layer of metal, illustrated in phantom as 25, could be applied to surface 24, to produce a short-circuit instead of an open circuit. Often, a short-circuit produced by such a metallic layer will be preferable to an open circuit, because of the tendency of an open circuit to radiate into space.

The apparatus of FIG. 1 may also be used to modulate a light beam by reflection. This may be accomplished, for example, by passing optical fiber 1.6 through an optical directional coupler designated 36, which includes a coupled optical fiber 38. Optical directional couplers are widely available, and are often known as twisted or tapered-fiber couplers, or star couplers, when they include a plurality of coupled fibers. In the arrangement of FIG. 1, when unmodulated light is applied from source 14, through coupler 36 to crystal 12 at port 17, and RF from block 18 is applied in an ON-OFF pulsed manner, the nonlinear interaction in region 32 of crystal 12 results in a pulsatory change in the index of refraction of the crystal, which causes light to be reflected back into fiber 16 in response to the pulsations of the RF. This light travels back through optical fiber 16 to coupler 36, and a portion of the light traveling in the retrograde direction is coupled out by way of coupled fiber 38. Thus, the apparatus of FIG. 1 may also be used as a reflective light modulator.

In order to achieve significant modulation depth when the apparatus of FIG. 1 is used as an RF modulator, it is desirable that the light beam by which modulation is accomplished affect a significant portion of the crystal through which the RF passes. The reason for this is readily understood by considering how much modulation of the RF would occur if, for example, the light affected only 1% of the crystal cross-section through which the RF passed. Even a large change in the dielectric constant of 1% of the material cross-section would be unlikely to significantly affect the RF transmission. The slight impedance mismatch between the crystal and the dielectric waveguide may cause a standing wave in the crystal. If such a standing wave occurs, the light beam should be located at a voltage maximum.

Figure 2:
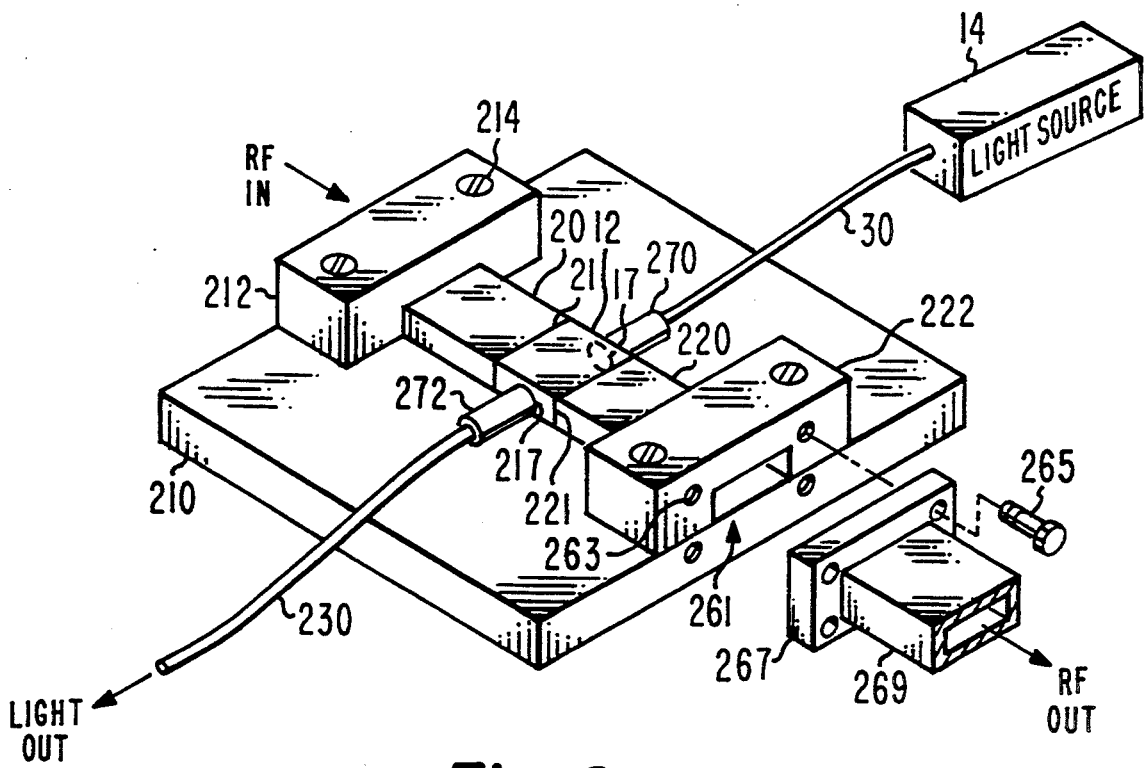
FIG. 2 is a simplified perspective or isometric view of a modulator according to another aspect of the invention.

FIG. 2 illustrates another embodiment of the invention, in which elements corresponding to those of FIG. 1 are designated by like reference numerals. In FIG. 2, a support plate 210 supports crystal 12 and dielectric waveguide 20. Dielectric waveguide 20 terminates in a dielectric-waveguide-to-hollow-conductive-waveguide transition 212, which is fastened to support plate 210 by screws 214. Instead of being terminated in an open circuit or a short circuit as in FIG. 1, crystal 12 of FIG. 2 has a second RF port 221, which is connected to a second dielectric waveguide 220, which terminates in a dielectric-waveguide-to-hollow-conductive-waveguide transition 222, which has a hollow conductive waveguide connection flange 261 and conventional waveguide 269 on the side visible in FIG. 2. Connection 261, as is common with such connections, includes a plurality of holes threaded for accepting screws, one of which is illustrated as 265, for holding a conventional waveguide flange connector 267, illustrated exploded away from transition 222 for ease of understanding. The side of transition 212 which is not visible in FIG. 2 is similarly arranged for connection of a conventional waveguide, not illustrated. The arrangement of FIG. 2 allows RF energy to enter transition 212 from a source of RF energy, and be coupled through transition 212, dielectric waveguide 20, crystal 12, second dielectric waveguide 220, and through transition 222, flange 267 and conventional waveguide 269 to a utilization device (not illustrated in FIG. 2).

FIG. 2 also illustrates a light input port 17 on crystal 12, but instead of being directly connected to an optical fiber 30 as in the arrangement of FIG. 1, the coupling of light from fiber 30 to light input port 17 is accomplished with the aid of a beam expanding and straightening lens or collimator 270, which expands the light beam, so that the beam affects substantially the entire cross-section of the crystal through which the RF energy passes, to thereby effect a substantial depth of modulation.

Figure 3:
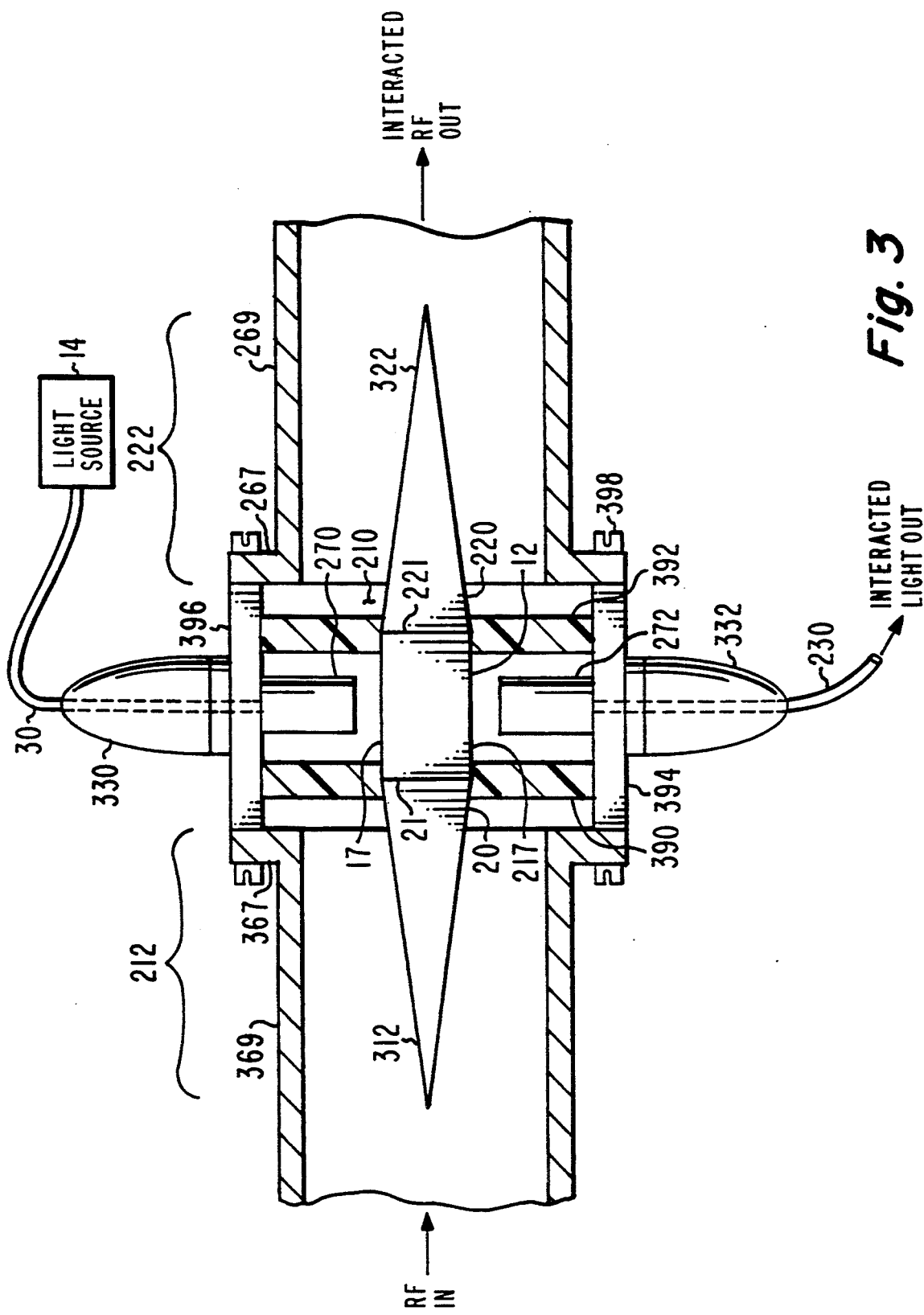
FIG. 3 is a cross-sectional view of the arrangement of FIG. 2.

In FIG. 2, a light output port 217 of crystal 12 is coupled by a second lens or collimator 272 to an output optical fiber 230. FIG. 3 is a plan view of the arrangement of FIG. 2, illustrating details of dielectric-waveguide-to-hollow-conductive-waveguide transition 212, and how the elements are mounted to minimize the dimensions of the structure. In FIG. 3, dielectric waveguide 20 is coupled at one end to RF port 21 of crystal 12, and at its other end to a tapered dielectric transition portion 312, which extends into a hollow conductive waveguide 369. For minimized length, dielectric waveguide 20 is made as an extension of tapered transition 312, and only reaches a transverse dimension equal to that of crystal 12 at RF input port 21. When the crystal is cylindrical, the transverse dimension is a diameter. Similarly, dielectric waveguide 220 is made a part of a tapered dielectric transition 322, which reaches its full transverse dimension at RF output port 221o Crystal 12, dielectric waveguides 20 and 220, and tapered dielectric transition 312 and 322 are supported by dielectric support plates 390 and 392. Dielectric support plates 390 and 392 are made from a low dielectric constant ($\epsilon_r$), low loss tangent material such as REXOLITE. Dielectric support plates 390 and 392 are adhesively supported by support plate 210, and by side support plates 394 and 396. Waveguide flanges 267 and 367 are affixed by screws, one of which is designated 398, to side support plates 394 and 396.

The length of crystal 12 between ports 21 and 221 in the arrangement of FIG. 2 is preferably $\lambda g/2$ at the RF operating frequency, where $\lambda g$ is the wavelength in the dark crystal. In the preferred embodiment in which the crystal is DAST,, the dielectric constant $\epsilon r$ (dark) is approximately eight. In the presence of light, $\epsilon_r$ drops to about 7.8. The impedance transformation provided by a tapered transition such as 312 becomes better as the length of the taper increases.

In FIG. 3, input optical fiber 30 extends through a strain relief or connector 330, and is fastened into an aperture in side plate 396. Such fastenings are often achieved by soldering a metallization on the optical fiber to the aperture in the plate. Lens 270 is affixed to the inside of side plate 396, and may be a gradient-index (GRIN) lens, such as a SELFOC lens Model No. SLW-1.0-0.25-82-1.30, manufactured by NSG America, Inc., Somerset, N.J. 08873. Similarly, output optical fiber 230 extends through a strain relief or connector 332 and is fastened in an aperture through side plate 394. A second SELFOC lens is coupled to optical fiber 230 on the inner side of side plate 394.

In operation of the arrangement of FIG. 3, light source 14 may be modulated, and the modulated light is coupled by optical fiber 30 to crystal 12, together with unmodulated RF energy from waveguide 369. The modulation of the light affects the crystal, creating a nonlinear interaction, which affects the transmission of RF :from crystal port 21 to port 221, thereby modulating the RF with the information from the light source. The unmodulated RF from waveguide 369 is thus converted into modulated RF entering waveguide 269. This mode of operation may be used at an RF transmission location, for modulating the RF with signal derived from light, or it may be used at a light signal receiving location, for converting the information originally carried at light frequencies to the lower RF frequency, which is a form of demodulation. Similarly, light source 14 may be unmodulated, and the RF signal arriving by way of waveguide 369 may be modulated with information. The nonlinear interaction changes the transmission of light through the crystal, resulting in the appearance of modulated light on optical fiber 230, in response to the information carried by the RF. This mode of operation may be used at a light transmitter location, for modulating the light to be transmitted, or it may be used at an RF receiving location, for extracting information onto a light beam for further processing.

Other embodiments of the invention will be apparent to those skilled in the art. For example, the nonlinear material need not be crystalline, and may even be a fluid, so long as a container or other constraint is provided therefor, or might even be a plasma, if appropriate. The ports designated as input and output ports may, of course, be reversed, as the structure is bidirectional.

What is claimed is:

1. A nonlinear interaction apparatus, comprising:
   a transparent nonlinear interaction dielectric material having a dielectric constant;
   light: coupling means coupled to said nonlinear interaction dielectric material for coupling light through a light entrance region into an interaction region of said nonlinear interaction dielectric material; and
   RF coupling means coupled to said nonlinear interaction dielectric material, for coupling RF energy through an RF entrance region into said interaction region of said nonlinear interaction dielectric material, for thereby allowing nonlinear interaction between said light and said RF, said RF coupling means comprising a linear dielectric waveguide coupled to said RF entrance region of said nonlinear interaction dielectric material for coupling said RF into said nonlinear interaction dielectric material, whereby interaction may occur between said light and said RF to thereby generate nonlinear products.

2. An apparatus according to claim 1, wherein said dielectric waveguide is impedance matched to said nonlinear interaction dielectric material.

3. An apparatus according to claim 2, wherein said linear dielectric of said dielectric waveguide has a dielectric constant substantially equal to that of said nonlinear interaction dielectric material.

4. An apparatus according to claim 1, further comprising output coupling means coupled to said nonlinear interaction dielectric material, for coupling one of said light and RF, together with its associated nonlinear products, from said nonlinear interaction dielectric material.

5. An apparatus according to claim 4, wherein:
   said light coupling means couples said light along a light path extending from said light entrance region through said interaction region of said nonlinear interaction dielectric material;
   said output coupling means couples said light and its associated nonlinear products; and
   said output coupling means is coupled to said nonlinear interaction dielectric material at an output location which lies on said light path at a location on the opposite side of said nonlinear interaction region from said light entrance region.

6. An apparatus according to claim 4, wherein:
   said RF coupling means couples said RF along an RF path extending from said RF entrance region through said interaction region of said nonlinear interaction dielectric material;
   said output coupling means couples said RF and its associated nonlinear products; and
   said output coupling means is coupled to said nonlinear interaction dielectric material at an output location which lies on said RF path at a location on the opposite side of said nonlinear interaction region from said RF entrance region.

7. An apparatus according to claim 1, wherein said nonlinear interaction material is a solid.

8. An apparatus according to claim 1, further comprising a dielectric-waveguide-to-hollow-conductive-waveguide transition.

9. An apparatus according to claim 1, wherein
   said nonlinear dielectric material is in the shape of a cylinder; and
   said dielectric waveguide includes a cylindrical portion adjacent said RF entrance region of said dielectric material.

10. A method for creating a nonlinear interaction between light and RF in a transparent nonlinear dielectric medium, comprising the steps of
    applying said RF, at a power level, through a dielectric waveguide in contact with a first port of said medium, whereby said RF propagates through said medium;
    applying said light through a second port of said medium, at a power level selected in conjunction with said power level of said RF to cause nonlinear interaction in said medium, along a path selected to intersect with said RF in an interaction region within said medium, to thereby cause said nonlinear interaction; and
    coupling at least one of said RF and said light, together with associated products of said nonlinear interaction, from said medium by way of a port, which may include one of said first and second ports of said medium.

11. A method according to claim 10, wherein said step of applying said RF further comprises the step of:
    applying said RF through a hollow conductive waveguide and a tapered dielectric transition portion of said dielectric waveguide.

* * * * *